US010790037B2

(12) United States Patent
Jeong

(10) Patent No.: US 10,790,037 B2
(45) Date of Patent: Sep. 29, 2020

(54) CIRCUIT FOR GENERATING BIAS CURRENT FOR READING OTP CELL AND CONTROL METHOD THEREOF

(71) Applicant: MagnaChip Semiconductor, Ltd., Cheongju-si (KR)

(72) Inventor: Duk Ju Jeong, Seoul (KR)

(73) Assignee: MAGNACHIP SEMICONDUCTOR, LTD., Cheongju-si (KR)

( * ) Notice: Subject to any disclaimer, the term of this patent is extended or adjusted under 35 U.S.C. 154(b) by 10 days.

(21) Appl. No.: 15/611,645

(22) Filed: Jun. 1, 2017

(65) Prior Publication Data

US 2018/0053563 A1 Feb. 22, 2018

(30) Foreign Application Priority Data

Aug. 17, 2016 (KR) .......................... 10-2016-0104527

(51) Int. Cl.
 *G11C 17/18* (2006.01)
 *G05F 3/26* (2006.01)
 *G11C 17/16* (2006.01)

(52) U.S. Cl.
 CPC .............. *G11C 17/18* (2013.01); *G05F 3/262* (2013.01); *G11C 17/165* (2013.01)

(58) Field of Classification Search
 CPC ........ G11C 17/18; G11C 17/165; G05F 3/262
 USPC .......................................................... 365/96
 See application file for complete search history.

(56) References Cited

U.S. PATENT DOCUMENTS

| 6,462,527 | B1* | 10/2002 | Maneatis | G05F 3/262 323/313 |
| 7,304,532 | B2* | 12/2007 | Kim | G05F 3/242 327/525 |
| 9,829,906 | B2* | 11/2017 | Yamahana | G05F 3/262 |
| 2004/0227499 | A1* | 11/2004 | Date | G09G 3/3241 323/315 |
| 2006/0001481 | A1* | 1/2006 | Koizumi | G05F 3/262 327/541 |
| 2008/0001672 | A1* | 1/2008 | Shih | G05F 3/262 330/288 |
| 2008/0024105 | A1* | 1/2008 | Wang | G05F 3/262 323/315 |
| 2008/0037351 | A1* | 2/2008 | Kim | G11C 17/16 365/225.7 |
| 2009/0285036 | A1* | 11/2009 | Kobatake | G11C 5/147 365/189.09 |
| 2010/0014373 | A1* | 1/2010 | Anand | G11C 17/16 365/225.7 |

(Continued)

FOREIGN PATENT DOCUMENTS

KR 10-1210286 B1 12/2012

*Primary Examiner* — Sung Il Cho
(74) *Attorney, Agent, or Firm* — Adam P. Daniels, Esq.; Polsinelli

(57) ABSTRACT

Provided is a circuit for generating a bias current, which includes a current generation unit including a plurality of current mirrors that generate a plurality of currents having different levels. The circuit also includes a current generation control unit that controls the generating the plurality of current having different levels in the current generation unit based on an externally input current. The circuit further includes a current supplying unit that supplies a current selected from the plurality of currents having different levels to an external device.

21 Claims, 3 Drawing Sheets

(56) References Cited

U.S. PATENT DOCUMENTS

| | | | | |
|---|---|---|---|---|
| 2010/0327843 | A1* | 12/2010 | Tesu | G05F 3/262 |
| | | | | 323/315 |
| 2011/0026354 | A1* | 2/2011 | Lin | G11C 8/12 |
| | | | | 365/226 |
| 2011/0084682 | A1* | 4/2011 | Yu | G05F 3/262 |
| | | | | 323/315 |
| 2011/0175666 | A1* | 7/2011 | Ballenegger | H03F 3/005 |
| | | | | 327/337 |
| 2011/0273231 | A1* | 11/2011 | Nakamura | G05F 3/262 |
| | | | | 330/257 |
| 2011/0304362 | A1* | 12/2011 | Matsubara | G05F 3/262 |
| | | | | 327/109 |
| 2012/0176198 | A1* | 7/2012 | Tanaka | G05F 3/262 |
| | | | | 330/288 |
| 2012/0281450 | A1* | 11/2012 | Lee | G11C 17/18 |
| | | | | 365/96 |
| 2013/0141168 | A1* | 6/2013 | Nozaki | H03F 1/0261 |
| | | | | 330/296 |
| 2013/0257550 | A1* | 10/2013 | Ishikawa | H03L 1/022 |
| | | | | 331/109 |
| 2014/0132242 | A1* | 5/2014 | Omoto | G05F 3/262 |
| | | | | 323/317 |
| 2017/0195601 | A1* | 7/2017 | Yun | H04N 5/3575 |

* cited by examiner

CIRCUIT FOR GENERATING BIAS CURRENT FOR READING OTP CELL AND CONTROL METHOD THEREOF

CROSS-REFERENCE TO PRIOR APPLICATIONS

This application claims priority to and the benefit thereof from Korean Patent Application No. 10-2016-0104527 filed on Aug. 17, 2016 in the Korean Intellectual Property Office, the entirety of which is incorporated herein by reference.

FIELD OF THE DISCLOSURE

The present disclosure relates to a circuit for generating a bias current for reading a one-time programmable (OTP) cell and a control method thereof. The present disclosure also relates to a generation circuit for generating a bias current for reading an OTP cell and a control method thereof for preventing a failure of read operation by selectively using a bias current of different values during an OTP cell's programming operation and a read operation.

BACKGROUND OF THE DISCLOSURE

One-time programmable (OTP) memory devices are common types of semiconductor memory devices, wherein a writing operation is made impossible once an initial programming operation is completed. That is, once programmed, the contents cannot be changed and the contents are retained after power is removed. Only read operations are allowed thereafter, which may be carried out in virtually unlimited number of ways. The most commonly used method for programming an OTP memory is a fuse method. The fuse method is a way of determining the binary information depending on whether the fuse is cut or connected.

A non-volatile memory (NVM) has recently been embedded in a power management integrated circuit (PMIC). For NVMs, a number of technologies are available, including embedded floating gate-based electrically erasable read-only memory (EEPROM) flash memory that can be rewritten many times. EEPROM flash memory, however, disadvantageously requires additional manufacturing process steps that result in increased manufacturing costs. On the other hand, an OTP NVM memory using an electrical fuse method or an anti-fuse method does not need any additional manufacturing process steps. The anti-fuse method is a way of fusing by supplying a high voltage beyond a breakdown voltage to a transistor gate oxide film and thus shorting the gate oxide film. Anti-fuse OTP memory is a useful, reliable, low-cost solution for embedded applications such as PMIC, since the OTP memory may be programmed on-chip during manufacture or in the embedded application without any additional process steps.

In an OTP cell manufactured according to the conventional anti-fuse method, a reference current generator takes the role of supplying a bias current required for a read operation of the OTP cell. At this time, through one bias current being generated in the reference current generator, an identical current may be used during a read operation as well as during the OTP cell's programming operation. The current during the programming operation at the programming stage signifies a current during a read operation to verify the programming, and a current during a read operation means a current during a general read operation performed after the programming is complete.

During an OTP cell programming operation, a current path is generated to let a current flow between a gate and a well by destroying gate oxide materials, and as a current path is formed like resistance, there is a problem of a reading failure during a read operation of a cell with completed programming due to an increased resistance value when a reliability experiment is performed after the programming is complete.

SUMMARY OF THE DISCLOSURE

According to an aspect of the disclosure, a circuit for generating a bias current includes a current generation unit including a plurality of current mirrors that generate a plurality of currents having different levels, a current generation control unit that controls the generating the plurality of currents having different levels in the current generation unit based on an externally input current, and a current supplying unit that supplies a current selected from the plurality of currents having different levels to an external device.

The current generation controlling unit may include a control signal input terminal providing a control signal to a first transistor of a first type connected to the externally input current and a gate terminal of the first transistor of the first type, and an inverter supplying the control signal to the current generation unit by inverting the control signal.

The circuit may further include second and third transistors of the first type connected to a source terminal of the first transistor of the first type in parallel, wherein source terminals of the second and third transistors of the first type may be connected to a ground.

The circuit may further include a current mirror comprising first and second transistors of a second type, and fourth and fifth transistors of the first type, wherein drain terminals of the fourth and fifth transistors of the first type may be connected to an output of the current mirrors, and source terminals of the fourth and fifth transistors of the first type may be connected to the ground A gate terminal of the third transistor of the first type and a gate terminal of the fourth transistor may be connected to each other, and a drain terminal of the third transistor of the first type may be connected to a gate terminal of the third transistor of the first type.

The current generation unit may include a low current generation unit and a high current generation unit.

A gate terminal of the second transistor of the first type may be connected to the inverter input.

The high current generation unit may include a plurality of transistors of the first type, and the drain terminal of the third transistor of the first type may be connected to the gate terminals of a plurality of transistors of the first type of the high current generation unit in common so as to have a current mirror relation with the third transistor of the first type.

The low current generation unit may include a plurality of transistors of the first type, and the drain terminal of the fifth transistor of the first type may be connected to the gate terminal of the fifth transistor and to the gate terminals of a plurality of transistors of the first type of the low current generation unit in common so as to have a current mirror relationship with the fifth transistor of the first type.

The circuit may further include a sixth transistor of the first type including a drain terminal connected to the gate terminal of the fifth transistor of the first type, and a source terminal connected to the ground.

The inverted control signal may be supplied to the gate terminal of the sixth transistor of the first type.

Source terminals of the plurality of transistors of the first type of the current generation unit may be connected to the ground.

Drain terminals of the plurality of transistors of the first type of the current generation unit may be connected to a plurality of transfer gates, respectively.

The current supplying unit may include a current mirror comprising a plurality of transistors of a second type and supplies the current level selected from the plurality of transfer gates to the external device by mirroring.

The plurality of currents having different levels may be generated by varying sizes of the plurality of transistors of the first type of the current generation unit.

According to another aspect of the disclosure, a method for reading a one-time programmable (OTP) memory cell, which includes generating a plurality of currents having different levels using a current mirror including a plurality of transistors of a first type based on an externally input current. One of the plurality of currents having different levels is selected using a plurality of transfer gates. A read operation is performed by sensing a bit line voltage determined by a level of the selected current. The sensed bit line voltage is stored into a data output unit during a period of a reading enable signal being high.

The read operation may include verifying whether a programming operation is performed at a cell programming stage.

An input current used for the verifying may include a current having a level that is lower or higher than a level of the externally input current.

The read operation may be performed after completing the programming operation.

The current used during the read operation performed after completing the programming operation may include a current having a level lower than a level of the externally input current.

The read operation may be a read operation during the verifying whether the programming operation is performed or after completing the programming operation, and wherein a level of the current supplied during the verifying whether the programming operation is performed or after the completing the programming operation is higher than a level of the current during the read operation performed after completing the programming operation.

Additional features, advantages, and embodiments of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate embodiments of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1:
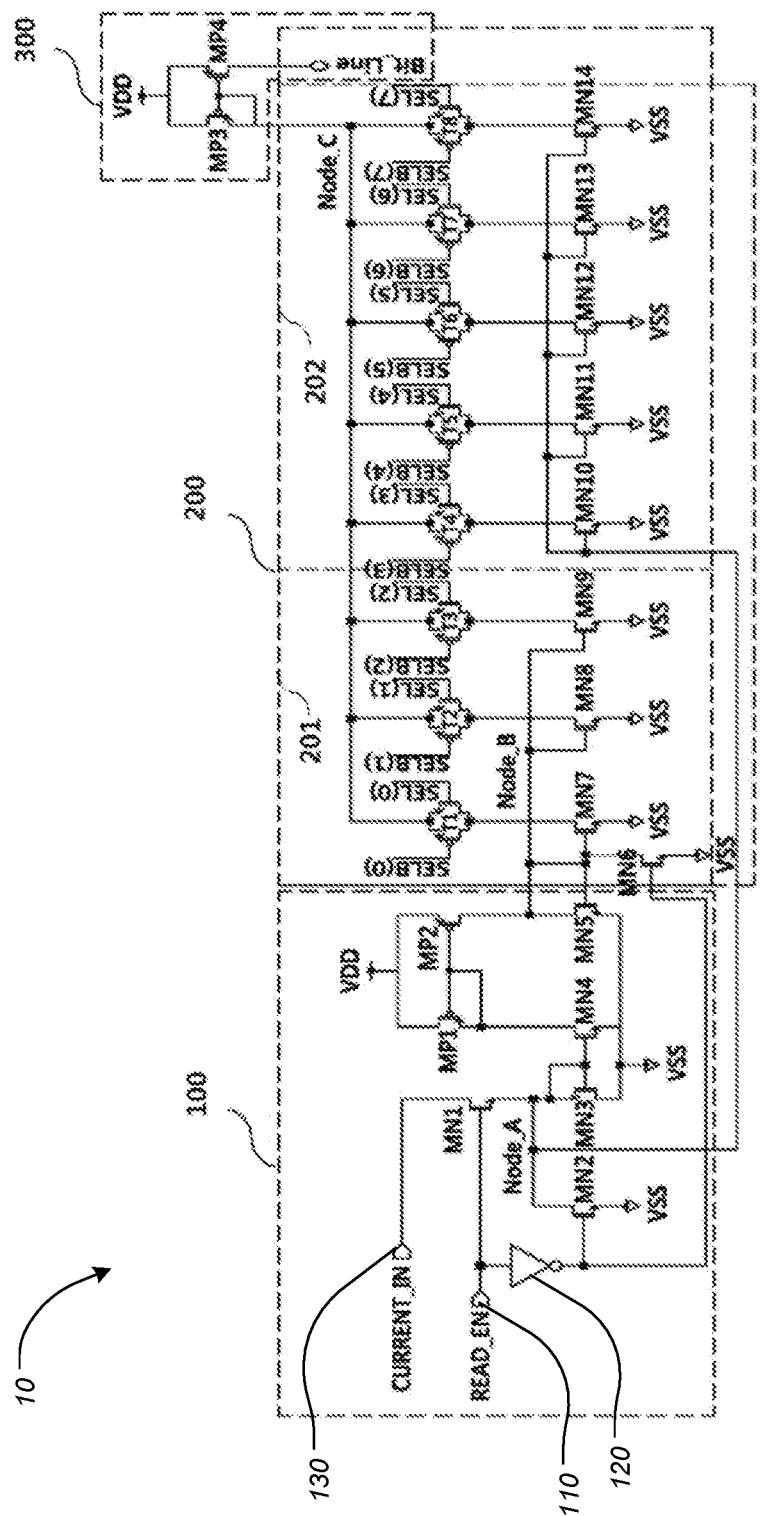
FIG. 1 is a circuit diagram illustrating a bias current generation circuit according to the principles of the disclosure.

The disclosure and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the disclosure. The examples used herein are intended merely to facilitate an understanding of ways in which the disclosure may be practiced and to further enable those of skill in the art to practice the embodiments of the disclosure. Accordingly, the examples and embodiments herein should not be construed as limiting the scope of the disclosure. Moreover, it is noted that like reference numerals represent similar parts throughout the several views of the drawings.

FIG. 1 is a circuit diagram illustrating an example of a bias current generation circuit 10, constructed according to the principles of the disclosure. The bias current generation circuit 10 may include, for example, a current generation control unit 100, a current generation unit 200, and a current supplying unit 300.

The current generation control unit 100 may control the current generation unit 200 based on, for example, an externally supplied input current so as to control the current generation unit 200 to generate a current with different levels.

The current generation control unit 100 may include, for example, a control signal input terminal 110, an inverter 120, an external current input terminal 130, and a plurality of transistors, such as, for example, a plurality of first type (e.g., N-type) metal-oxide semiconductor field-effect transistors (MOSFETs) (e.g., first to fifth N-type MOSFETs MN1-MN5), and a plurality of second type (e.g., P-type) MOSFETs (e.g., first and second P-type MOSFETs MP1, MP2). The control signal input terminal 110 may supply control signals to a gate terminal of the first N-type MOSFET MN1. A drain terminal of the first N-type MOSFET MN1 may be connected to the external current input terminal 130. The inverter 120 may supply the control signal to the current generation unit 200 by, for example, inverting it.

The second and third N-type MOSFETs MN2, MN3 may be connected in parallel to the source terminal of the first N-type MOSFET MN1, and the source terminals of the second and third N-type MOSFETs MN2, MN3 may be connected to the ground. The first and second P-type MOSFETs MP1, MP2 may form a current mirror, and the drain terminals of the fourth and fifth N-type MOSFETs MN4, MN5 may be connected to the outputs of the current mirror. The source terminals of the fourth and the fifth N-type MOSFETs MN4, MN5 may be connected to the ground. The gate terminal of the second N-type MOSFET MN2 may be connected to the output of the inverter 120. The gate terminals of the third and fourth N-type MOSFETs MN3, MN4 may be connected to each other, and the drain terminal of the third N-type MOSFET MN3 may be connected to the gate of the third N-type MOSFET MN3.

The current generation unit 200 may include a low current generation unit 201 and a high current generation unit 202. The current generation unit 200 may be constructed with a plurality of N or P-type transistors connected in parallel (e.g., N-type MOSFETs MN6-MN14). For example, the low current generation unit 201 may include sixth to ninth N-types MOSFETs MN6-MN9, and the high current generation unit 202 may include tenth to fourteenth N-type MOSFETs MN10-MN14. In the current generation unit 200, currents having different levels may be generated through a plurality of current mirrors. In order for the high current generation unit 202 to have a current mirror relationship with the third N-type MOSFET MN3, the drain terminal of the third N-type MOSFET MN3 may be connected to the gate terminals of the N-type MOSFETs MN10-MN14. The drain terminal of the fifth N-type MOSFET MN5 may be connected to the gate of the N-type MOSFETs MN7-MN9 such that the low current generation unit 201 may have a current mirror relationship with the fifth N-type MOSFET MN5.

The high current generation unit 202 may amplify the current by receiving the input current value from a plurality of external control blocks and the low current generation unit 201 may decrease the current. The gate terminals of the N-type MOSFETs MN6-MN14 may be connected to the current generation control unit 100, and the source terminals of the N-type MOSFETs MN6-MN14 may be connected to the ground. A plurality of transfer gates T1-T8 may be connected to the drain terminals of the seventh to fourteenth N-type MOSFETs MN7-MN14, respectively.

The current supplying unit 300 may supply a current selected from the currents having different levels generated in the current generation unit 200 to an external device Namely, the current supplying unit 300 may include a current mirror, which may be constructed with, for example, third and fourth P-type MOSFETs MP3, MP4, and may supply the selected current level from the transfer gates T1-T8 to the external device by mirroring.

The bias current generation circuit 10 shown in FIG. 1 may be constructed based on a current mirror. The high current generation unit 202 may be connected to node A, and the low current generation unit 201 may be connected to node B.

The generated current value may be determined based on, for example, the size ratio of the N-type MOSFET MN3-MN5 to the N-type MOSFET MN7-MN14. To take an example of the operation of the low current generation unit 201, the current flowing through the fourth N-type MOSFET MN4 becomes 0.5 μA when the input current value is 1.5 μA and the ratio of MN3 and MN4 is 3:1.

If the sizes of the first and second P-type MOSFETs MP1, MP2 are designed to be equal, the current flowing through the fourth and fifth N-type MOSFETs MN4 and MN5 becomes identical to each other. When the size ratio of the fifth and seventh N-type MOSFETs MN5 and MN7 is designed to be 4:1, the current flowing through the seventh N-type MOSFET MN7 becomes 0.125 μA. Likewise, when the size ratio of the fifth and eighth N-type MOSFETs MN5, MN8 is designed to be 4:2, the current flowing through the eighth N-type MOSFET MN8 becomes 0.25 μA in the exampled mentioned above. In this way, the current value flowing through the ninth N-type MOSFET MN9 may be controlled by controlling the size ratio of the fifth and ninth N-type MOSFETs MN5, MN9.

Regarding the high current generation unit 202, the current value may be determined by the size ratio of the third N-type MOSFET MN3 and the tenth to fourteenth N-type MOSFET MN10-MN14. For instance, when the input current value is 1.5 μA and the size ratio of the third N-type MOSFET MN3 and the tenth N-type MOSFET MN10 is 1:2, the current value flowing through MN10 becomes 3.0 μA. Likewise, when the size ratio of the third N-type MOSFET MN3 and the fourteenth N-type MOSFET MN14 is 1:4, the current value flowing through MN14 becomes 6 μA. In this way, a control circuit may be constructed, which may selectively use the current value for a read operation of a programmed OTP cell based on an external input current.

Figure 2:
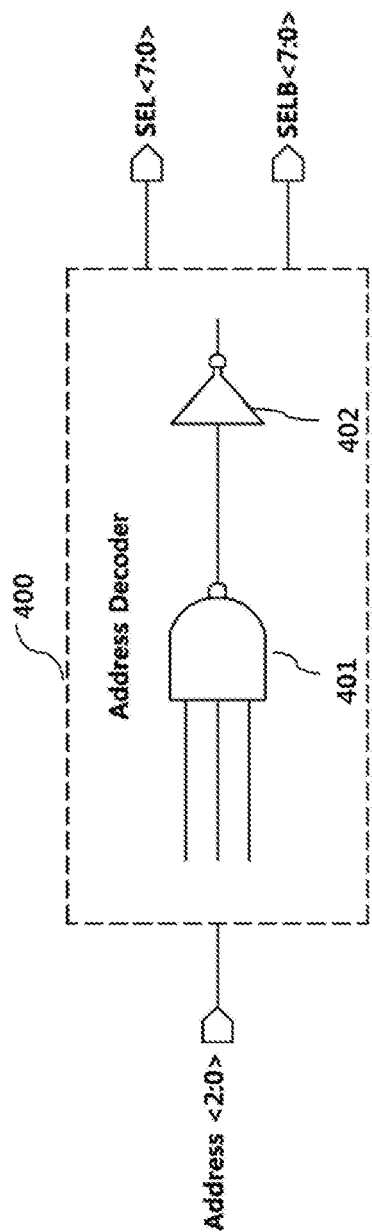
FIG. 2 is a circuit diagram of an address decoder circuit according to the principles of the disclosure.

FIG. 2 is a circuit diagram of an example of an address decoder circuit 400, which is constructed according to the principles of the disclosure. The decoder circuit 400 may include a NAND gate 401 and an Inverter 402 connected in series.

Figure 3:
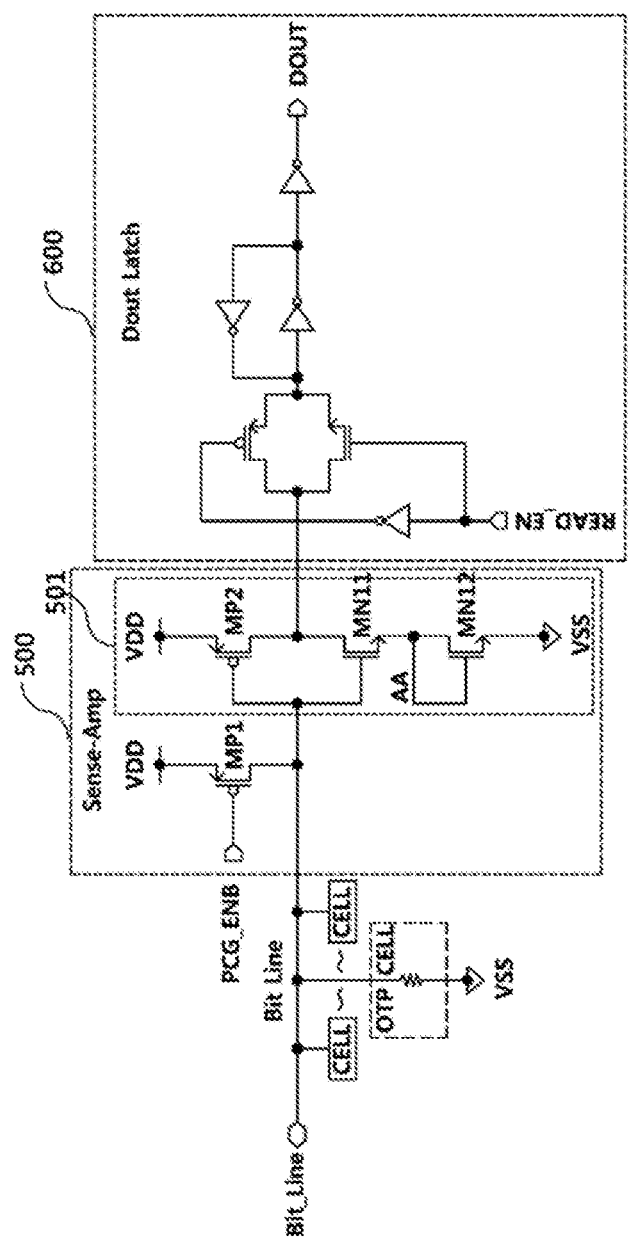
FIG. 3 is a circuit diagram illustrating a read operation of an OTP memory device according to the principles of the disclosure.

FIG. 3 is a circuit diagram illustrating an example of a read operation of an OTP memory device, constructed according to the principles of the disclosure.

Referring to FIGS. 2 and 3, in a programming operation of an OTP cell OTP CELL, a programming operation and a read operation may be performed as a single cycle. Namely, a read operation may be immediately performed after the OTP cell OTP CELL is programmed, and a programming operation may be performed for a bit that is not programmed. The programmed OTP cell may operate like a resistance of the OTP cell OTP CELL, as shown in FIG. 3. Namely, the voltage value of the bit line voltage may be determined by multiplying the current value flowing through the third P-type MOSFET MP3 and the resistance value of the OTP cell shown in FIG. 1. When the resistance value is the same, the larger the current flowing from the fourth P-type MOSFET MP4 becomes, and the larger the voltage value of the Bit Line also becomes.

Exemplary Embodiment

In a circuit for generating a bias current for a reading OTP cell according to the principles of the disclosure, during programming and read operation, an OTP cell may be programmed by increasing a current value, and after the completion of the programming, a read operation may be performed by lowering the current value flowing through the fourth P-type MOSFET MP4 of the current supplying unit 300 (shown in FIG. 1).

Referring to FIG. 3, the read operation may be performed through an inverter 501 (consisting of the second P-type MOSFET MP2 and the eleventh and twelfth N-type MOSFETs MN11, MN12 connected in series), when the bit line voltage Bit Line is below 1.0 V (VDD=1.5 V) and sensing is possible in the inverter 501, a read operation may be possible if the resistance value of the programmed cell is 1 MΩ and the current of 1 μA flows through the fourth P-type MOSFET MP4.

However, when the resistance value of the OTP cell is 1 MΩ and the current value flowing through the fourth P-type MOSFET MP4 is assumed to be 20 nA, the voltage of the bit line may be very low, for example, about 0.02 V and sensing by the inverter 501 can be more certain.

When the read operation during the programming operation is performed with a current of 1 μA at the resistance of 1 MΩ, after the voltage of the bit line is 1.0 V, the read operation is performed after the programming operation is completed, if selecting a bias current value of 20 nA in FIG. 1 and flowing it to the resistance value of 1 MΩ, a read operation can be normally performed even though the resistance value of 1 MΩ varies to 50 MΩ during such processes as a reliability test after completing the programming operation. This is because the voltage of the bit line becomes 1.0 V at 50 MΩ×20 nA and sensing through the inverter 501 at the sense amplifier 500.

Referring to FIG. 1, a selection signal (SEL) and an inverted selection signal (SELB) may be generated by accepting an address (Address) (shown in FIG. 2) provided externally, as seen in FIG. 3. It may be possible to select a desired current value through the selection signal SEL and the inverted selection signal SELB.

It may be possible to generate various current values through the selection by the selection signal SEL and the inverted selection signal SELB by locating more N-type MOSFETs compared to the seventh to fourteenth N-type MOSFETs MN7 to MN14 as shown in FIG. 1 and increasing the number of coding according to the number of addresses. As illustrated in FIG. 3, the sensed result may be stored in a Dout latch block 600 in the section where the read enable signal READ_EN is high.

In this way, it may be possible to amplify or decrease the current value according to the input current value since the read enable signal READ_EN is input as high during the read operation, a selective use of each different current value during a programming operation and a read operation of the OTP cell may become possible. Meanwhile, as a low reading enable signal READ_EN is input during the non-read operation section, amplifying of the current at the current generation unit 200 may not happen since the voltage at the node A and node B becomes a common ground voltage (Vss) by the second and sixth N-type MOSFET MN2 and MN6, the current consumed in FIG. 1 may disappear during the non-read operation section.

The read operation of an OTP memory device according to the principles of the disclosure may include generating different levels of currents through a current mirror composed of the seventh to fourteenth N-type MOSFETs MN7-MN14 based on the externally input current value; selecting one of the different levels of currents through a plurality of transfer gates T1-T8; performing a read operation by sensing the bit line voltage determined by the selected current value; and storing the sensed result to the date output unit at the section where the reading enable signal READ_EN is high.

Herein the read operation may mean the stage of verifying the programming during the programming of a cell, and the input current used for verifying the programming is a current with a lower or higher level compared to the externally input current. Herein, the current with a lower level compared to the externally input current may mean a current with higher level than the low voltage during the read operation after completing the programming. Also, the read operation may be proceeded after completing the programming at the cell, and the current used for the read operation after completing the programming may be a current with lower level compared to the externally input current.

The terms "including," "comprising" and variations thereof, as used in this disclosure, mean "including, but not limited to," unless expressly specified otherwise.

The terms "a," "an," and "the," as used in this disclosure, means "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

Although process steps, method steps, or the like, may be described in a sequential order, such processes and methods may be configured to work in alternate orders. In other words, any sequence or order of steps that may be described does not necessarily indicate a requirement that the steps be performed in that order. The steps of the processes or methods described herein may be performed in any order practical. Further, some steps may be performed simultaneously.

When a single device or article is described herein, it will be readily apparent that more than one device or article may be used in place of a single device or article. Similarly, where more than one device or article is described herein, it will be readily apparent that a single device or article may be used in place of the more than one device or article. The functionality or the features of a device may be alternatively embodied by one or more other devices which are not explicitly described as having such functionality or features.

While the disclosure has been described in terms of exemplary embodiments, those skilled in the art will recognize that the disclosure can be practiced with modifications in the spirit and scope of the appended claim, drawings and attachment. The examples provided herein are merely illustrative and are not meant to be an exhaustive list of all possible designs, embodiments, applications or modifications of the disclosure.

What is claimed is:

1. A circuit for generating a bias current comprising:
   a current generation unit comprising a plurality of current mirrors that generate a plurality of currents having different levels;
   a current generation control unit that receives an external input current and controls the plurality of current mirrors based on the external input current;
   an address decoder coupled to the current generation unit, the address decoder is configured to select a current from the plurality of currents; and
   a current supplying unit that supplies the current selected from the plurality of currents to a One-Time Programmable (OTP) memory device.

2. The circuit of claim 1, wherein the current generation control unit comprises:
   a current input terminal that provides the external input current to a first transistor of a first type;
   a control signal input terminal that provides a control signal to a gate terminal of the first transistor; and
   an inverter that supplies an inverted control signal to the current generation unit.

3. The circuit of claim 2, wherein the current generation control unit further comprises:
   second and third transistors of the first type connected to a source terminal of the first transistor in parallel, and wherein source terminals of the second and third transistors are connected to a ground.

4. The circuit of claim 3, wherein the current generation control unit further comprises:
   a current mirror formed by two transistors of a second type; and
   fourth and fifth transistors of the first type, wherein drain terminals of the fourth and fifth transistors are connected to an output of the current mirror, and source terminals of the fourth and fifth transistors are connected to the ground.

5. The circuit of claim 3, wherein a gate terminal of the second transistor of the first type is connected to an output of the inverter.

6. The circuit of claim 4, wherein a gate terminal of the third transistor and a gate terminal of the fourth transistor are connected to each other, and a drain terminal of the third transistor is connected to a gate terminal of the third transistor.

7. The circuit of claim 4, wherein the current generation unit comprises a low current generation unit, and a high current generation unit comprising a plurality of transistors of the first type, and
wherein the drain terminal of the third transistor is commonly connected to the gate terminals of the plurality of transistors of the high current generation unit to have a current mirror relation with the third transistor.

8. The circuit of claim 7, wherein the plurality of transistors of the high current generation unit is a first plurality of transistors,
wherein the low current generation unit comprises a second plurality of transistors of the first type, and
wherein the drain terminal of the fifth transistor is commonly connected to the gate terminal of the fifth transistor and to the gate terminals of the second plurality of transistors to have a current mirror relationship with the fifth transistor.

9. The circuit of claim 8, further comprising a sixth transistor of the first type comprising a drain terminal connected to the gate terminal of the fifth transistor of the first type, and a source terminal connected to the ground.

10. The circuit of claim 9, wherein the gate terminal of the sixth transistor receives the inverted control signal.

11. The circuit of claim 10, wherein source terminals of the first plurality of transistors and the second plurality of transistors of the current generation unit are connected to the ground.

12. The circuit of claim 11, wherein drain terminals of the first plurality of transistors and the second plurality of transistors of the current generation unit are connected to a plurality of transfer gates, respectively.

13. The circuit of claim 12, wherein the current supplying unit comprises a current mirror formed by transistors of the second type, and wherein the current mirror supplies the current selected from the plurality of transfer gates to the external device.

14. The circuit of claim 13, wherein the plurality of currents are generated by size differences of the first plurality of transistors and the second plurality of transistors of the current generation unit.

15. The circuit of claim 1, wherein the current generation unit comprises a low current generation unit and a high current generation unit.

16. The circuit of claim 1, wherein the current generation unit further comprises a plurality of transfer gates coupled to the address decoder and the plurality of current mirrors.

17. A circuit for generating a bias current, the circuit comprising:
a current generation unit comprising a plurality of current mirrors that generate a plurality of currents having different levels;
a current generation control unit that receives an external input current and controls the plurality of current mirrors based on the external input current, the current generation control unit having a first transistor of a first type;
a current supplying unit that supplies a current selected from the plurality of currents to a One-Time Programmable (OTP) memory device; and
a control signal input terminal that provides a control signal for a read operation to a gate terminal of the first transistor.

18. The circuit of claim 17, wherein the current generation control unit comprises:
an inverter that supplies an inverted control signal to the current generation unit.

19. The circuit of claim 18, further comprising second and third transistors of the first type connected to a source terminal of the first transistor in parallel,
wherein source terminals of the second and third transistors are connected to a ground.

20. The circuit of claim 19, further comprising:
a current mirror formed by two transistors of a second type, the circuit further comprising:
fourth and fifth transistors of the first type, wherein drain terminals of the fourth and fifth transistors are connected to an output of the current mirror, and source terminals of the fourth and fifth transistors are connected to the ground.

21. The circuit of claim 20, wherein a gate terminal of the third transistor is connected to a gate terminal of the fourth transistor, and a drain terminal of the third transistor is connected to a gate terminal of the third transistor.

* * * * *